United States Patent
Rascuna' et al.

(10) Patent No.: US 12,051,725 B2
(45) Date of Patent: Jul. 30, 2024

(54) DOPING ACTIVATION AND OHMIC CONTACT FORMATION IN A SiC ELECTRONIC DEVICE, AND SiC ELECTRONIC DEVICE

(71) Applicant: STMICROELECTRONICS S.r.l., Agrate Brianza (IT)

(72) Inventors: Simone Rascuna', Catania (IT); Paolo Badala', Acireale (IT); Anna Bassi, Gravina di Catania (IT); Gabriele Bellocchi, Catania (IT)

(73) Assignee: STMICROELECTRONICS S.r.L., Agrate Brianza (IT)

( * ) Notice: Subject to any disclaimer, the term of this patent is extended or adjusted under 35 U.S.C. 154(b) by 0 days.

(21) Appl. No.: 18/309,584

(22) Filed: Apr. 28, 2023

(65) Prior Publication Data

US 2023/0343831 A1    Oct. 26, 2023

Related U.S. Application Data

(62) Division of application No. 17/226,003, filed on Apr. 8, 2021, now Pat. No. 11,670,685.

(30) Foreign Application Priority Data

Apr. 17, 2020 (IT) ........................ 102020000008167

(51) Int. Cl.
*H01L 29/872* (2006.01)
*H01L 29/16* (2006.01)
*H01L 29/66* (2006.01)

(52) U.S. Cl.
CPC ...... *H01L 29/1608* (2013.01); *H01L 29/1606* (2013.01); *H01L 29/6603* (2013.01); *H01L 29/66143* (2013.01); *H01L 29/872* (2013.01)

(58) Field of Classification Search
None
See application file for complete search history.

(56) References Cited

U.S. PATENT DOCUMENTS

| 8,962,468 B1 | 2/2015 | Hostetler |
| 2005/0104072 A1 | 5/2005 | Slater et al. |

(Continued)

FOREIGN PATENT DOCUMENTS

| CN | 109037041 A | 12/2018 |
| CN | 109326657 A | 2/2019 |

(Continued)

OTHER PUBLICATIONS

English translation of JP2015-153789 (Year: 2015).*

(Continued)

*Primary Examiner* — Xiaoming Liu
(74) *Attorney, Agent, or Firm* — SEED IP LAW GROUP LLP

(57) ABSTRACT

A method for manufacturing a SiC-based electronic device, that includes implanting, at a front side of a solid body of SiC having a conductivity of N type, dopant species of P type, thus forming an implanted region that extends in depth in the solid body starting from the front side and has a top surface co-planar with said front side; and generating a laser beam directed towards the implanted region in order to generate heating of the implanted region at temperatures comprised between 1500° C. and 2600° C. so as to form an ohmic contact region including one or more carbon-rich layers, for example graphene and/or graphite layers, in the implanted region and, simultaneously, activation of the dopant species of P type.

17 Claims, 5 Drawing Sheets

(56) References Cited

U.S. PATENT DOCUMENTS

| | | |
|---|---|---|
| 2006/0192256 A1 | 8/2006 | Cooper et al. |
| 2007/0066039 A1 | 3/2007 | Agarwal et al. |
| 2008/0099769 A1 | 5/2008 | Rupp et al. |
| 2009/0289262 A1* | 11/2009 | Zhang .................. H01L 29/872 257/E21.057 |
| 2013/0020585 A1 | 1/2013 | Ishibashi |
| 2013/0062620 A1 | 3/2013 | Henning et al. |
| 2013/0313573 A1* | 11/2013 | Mizukami ............. H01L 29/861 257/77 |
| 2015/0372093 A1 | 12/2015 | Saggio et al. |
| 2017/0077087 A1 | 3/2017 | Horikawa et al. |
| 2017/0170280 A1 | 6/2017 | Wakabayshi et al. |
| 2018/0097103 A1 | 4/2018 | Sadamatsu et al. |
| 2018/0175153 A1 | 6/2018 | Schulze et al. |
| 2018/0190651 A1 | 7/2018 | Siemieniec et al. |
| 2020/0044031 A1 | 2/2020 | Pham et al. |
| 2020/0303564 A1 | 9/2020 | Rascuna' et al. |
| 2021/0280424 A1 | 9/2021 | Rascuna' et al. |
| 2021/0328022 A1 | 10/2021 | Rascunáet al. |
| 2021/0399154 A1 | 12/2021 | Rascunáet al. |
| 2023/0282757 A1 | 9/2023 | Rascunáet al. |

FOREIGN PATENT DOCUMENTS

| | | |
|---|---|---|
| JP | 2011071281 A | 4/2011 |
| JP | 2014063948 A | 4/2014 |
| JP | 2015153789 A | 8/2015 |

OTHER PUBLICATIONS

Badala, P. et al., "Ni/4H—SiC interaction and silicide formation under excimer laser annealing for ohmic contact," *Materialia* 9 100528, 2020, 6 pages.

Kusdemir, E. et al., "Epitaxial graphene contact electrode for silicon carbide based ultraviolet photodetector," *Journal of Phys. D: Appl. Phys.* vol. 48, 2015, p. 1-6.

Lebedev, A. et al., "Low temperature transport properties of multigraphene structures on 6H—SiC obtained by thermal graphitization: evidences of a presence of nearly perfect graphene layer," *Cornell University* URL=https://arxiv.org/abs/1212.4272, downloaded on Dec. 18, 2012, 8 pages.

Lemaitre, M. et al., "Low-temperature, site selective graphitization of SiC via ion implantation and pulsed laser annealing," *Applied Physics Letters*, vol. 100, May 8, 2012, p. 193105-1-193105-4.

Lioliou, G. et al., "Electrical and ultraviolet characterization of 4H—SiC Schottky photodiodes," *Optics Express* 21657, vol. 23, No. 17, 2015, 14 pages.

Liu et al., "Visible blind p+/p/n−/n+ UV 4H—SiC photodiodes based on 4H—SiC homeopilayers," 2006 *8th International Conference on Solid-State and Integrated Circuit Technology Proceedings*, Oct. 2006, pp. 866-868.

Liu, F. et al., "Enhanced Ohmic contact via graphitization of polycrystalline silicon carbide," *Applied Physics Letters*, vol. 97, 2010, p. 262107-1-262107-3.

Lu, W. et al., "Catalytic graphitization and Ohmic contact formation on 4H—SiC," *Journal of Applied Physics*, vol. 93, No. 9, May 1, 2003 p. 5397-5403.

Mazzamuto, F. et al., "Low thermal budget ohmic contact formation by laser anneal," *Materials Sciemnce Forum*, vol. 858, 2016, 4 pages.

Rascuna, S. et al., "Morphological and electrical properties of Nickel based Ohmic contacts formed by laser annealing process on n-type 4H—SiC," *Manuscript submitted to Materials Science in Semiconductor Processing*, Nov. 20, 2018, 7 pages.

\* cited by examiner

DOPING ACTIVATION AND OHMIC CONTACT FORMATION IN A SiC ELECTRONIC DEVICE, AND SiC ELECTRONIC DEVICE

BACKGROUND

Technical Field

The present disclosure relates to a method for manufacturing a SiC electronic device, and a SiC electronic device thus obtained. In particular, the present disclosure regards a method for activation of doping and, simultaneously, an ohmic contact formation in a SiC electronic device.

Description of the Related Art

As is known, semiconductor materials, which present a wide band gap, in particular, an energy value Eg of the band gap higher than 1.1 eV, a low ON-state resistance ($R_{ON}$), a high value of thermal conductivity, a high operating frequency, and a high rate of saturation of the charge carriers, are ideal for producing electronic components, such as diodes or transistor, in particular for power applications. A material having these characteristics, and designed to be used for the manufacture of electronic components, is silicon carbide (SiC). In particular, silicon carbide, in its different polytypes (for example, 3C-SiC, 4H-SiC, 6H-SiC), is preferable to silicon as regards the properties listed previously.

Electronic devices provided on a silicon-carbide substrate, as compared to similar devices provided on a silicon substrate, present numerous advantages, such as a low output resistance in conduction, a low leakage current, a high operating temperature, and high operating frequencies. In particular, SiC Schottky diodes have shown a higher switching performance, which renders SiC electronic devices particularly favorable for high-frequency applications. Current applications impose requirements on the electrical properties and also on the long-term reliability of the devices.

FIG. 1 shows, in lateral sectional view in a (triaxial) Cartesian reference system of axes X, Y, Z, a merged-PiN-Schottky (MPS) device 1 of a known type.

The MPS device 1 includes: a substrate 3, of SiC of N type, having a first doping concentration, provided with a surface 3a opposite to a surface 3b, and having a thickness of approximately 350 µm; a drift layer (grown in an epitaxial way) 2, which is made of SiC of N type, has a second doping concentration lower than the first doping concentration, extends over the surface 3a of the substrate 3, and has a thickness comprised between 5 and 15 µm; an ohmic contact region 6 (for example, of nickel silicide), which extends over the surface 3b of the substrate 3; a cathode metallization 16, which extends over the ohmic contact region 6; an anode metallization 8, which extends over a top surface 2a of the drift layer 2; multiple junction-barrier (JB) elements 9 in the drift layer 2, which face the top surface 2a of the drift layer 2 and each include a respective implanted region 9' of P type and an ohmic contact 9" of metal material; and an edge-termination region, or protection ring, 10 (which is optional), in particular an implanted region of P type, which completely surrounds the JB elements 9.

Schottky diodes 12 are formed at the interface between the drift layer 2 and the anode metallization 8. In particular, Schottky junctions (between a semiconductor and a metal) are formed by portions of the drift layer 2 in direct electrical contact with respective portions of the anode metallization 8.

The region of the MPS device 1 that includes the JB elements 9 and the Schottky diodes 12 (i.e., the region contained within the protection ring 10) is an active area 4 of the MPS device 1.

The steps for manufacturing the MPS device 1 of FIG. 1 envisage a step of masked implantation of dopant species (for example, boron or aluminum), which have the second conductivity type (P), so as to form the implanted regions 9' and the edge-termination region 10. Then, a step of thermal annealing is carried out to enable diffusion and activation of the dopant species thus implanted. Thermal annealing is, for example, carried out at a temperature higher than 1600° C. (for example, between 1700° C. and 1900° C. and in some cases even higher). Following upon thermal treatment, the implanted regions 9' have a concentration of dopant species comprised approximately between $1 \cdot 10^{17}$ atoms/cm$^3$ and $1 \cdot 10^{20}$ atoms/cm$^3$.

Further steps are then carried out for formation of the ohmic contacts 9", which include a deposition of nickel exclusively at the implanted regions 9', in particular using a silicon-oxide mask to cover surface regions of the drift layer 2 other than the implanted regions 9'. A subsequent thermal annealing at high temperature (between 900° C. and 1000° C. for a time interval of from 1 min to 120 min) enables formation of nickel-silicide ohmic contacts 9", by chemical reaction between the deposited nickel and the silicon of the drift layer 2. In fact, the deposited nickel reacts with the surface material of the drift layer 2 to form $Ni_2Si$ (i.e., the ohmic contact), whereas the nickel in contact with the oxide of the mask does not react. Next, a step of removal of the metal that has not reacted and of the mask is carried out.

The steps described previously require several thermal-annealing steps for activation of the doping first and for the ohmic contact formation after. In addition, the step of deposition of the metal, which reacts with the drift layer 2 to form the ohmic contact 9", is critical in so far as an optimal alignment is required between the implanted region 9' and said deposited metal; in fact, a possible misalignment with contact of the metal useful for forming the ohmic contact 9" and with the region of the Schottky diode 12 could entail non-functioning of the device. In fact, an ohmic contact formed on the SiC epitaxy could bring about formation of a resistor, and no longer of a diode, or else of a Schottky contact with an extremely low barrier height. In either case, the device thus formed would not be usable owing to the high leakage in reverse biasing.

BRIEF SUMMARY

The present disclosure is to provide a method for manufacturing a SiC electronic device, and a corresponding SiC electronic device, that will be able to overcome the drawbacks of the prior art.

According to the present disclosure a method for manufacturing a SiC electronic device, and a corresponding SiC electronic device are provided. The method includes forming an implanted region by implanting dopants of a first conductivity type on a first side of a solid body of silicon carbide (SiC) having dopants of a second conductivity type, the first conductivity type being different than the second conductivity type, the implanted region extending in the solid body from the first side toward a second side, the implanted region having a first surface that is coplanar with a second surface of the first side. The method also includes forming an ohmic contact region including one or more carbon-rich layers of graphene, graphite, or a combination of graphene or graphite in the implanted region by generating a laser beam directed towards the implanted region thereby heating the implanted region to temperatures in the range of 1500° C. and 2600° C., and simultaneously, activating the dopant of the first conductivity type.

The present disclosure is also directed to a device that includes a silicon carbide substrate, an active layer on the silicon carbide substrate of a first conductivity type, the active layer including a surface. The device includes a first implanted region in the active layer, the first implanted region having a second conductivity type that is different from the first conductivity type, the first implanted region including a first surface, a first ohmic contact including carbon, the first ohmic contact being between the first surface and the silicon carbide substrate. The device also includes a second implanted region in the active layer, spaced from the first implanted region, the second implanted region having the second conductivity type and including a second surface, and a second ohmic contact including carbon, the second ohmic contact being between the second surface and the silicon carbide substrate, the second surface is coplanar with the first surface and coplanar with the surface of the active layer.

BRIEF DESCRIPTION OF THE SEVERAL VIEWS OF THE DRAWINGS

For a better understanding of the present disclosure, preferred embodiments thereof are now described, purely to way of non-limiting example, with reference to the attached drawings, wherein.

DETAILED DESCRIPTION

The present disclosure will be described with specific reference to a merged-PiN-Schottky (MPS) device; however, as will be evident from the ensuing description, the present disclosure applies in general to any SiC-based electronic device, such as a MOSFET.

Figure 1:
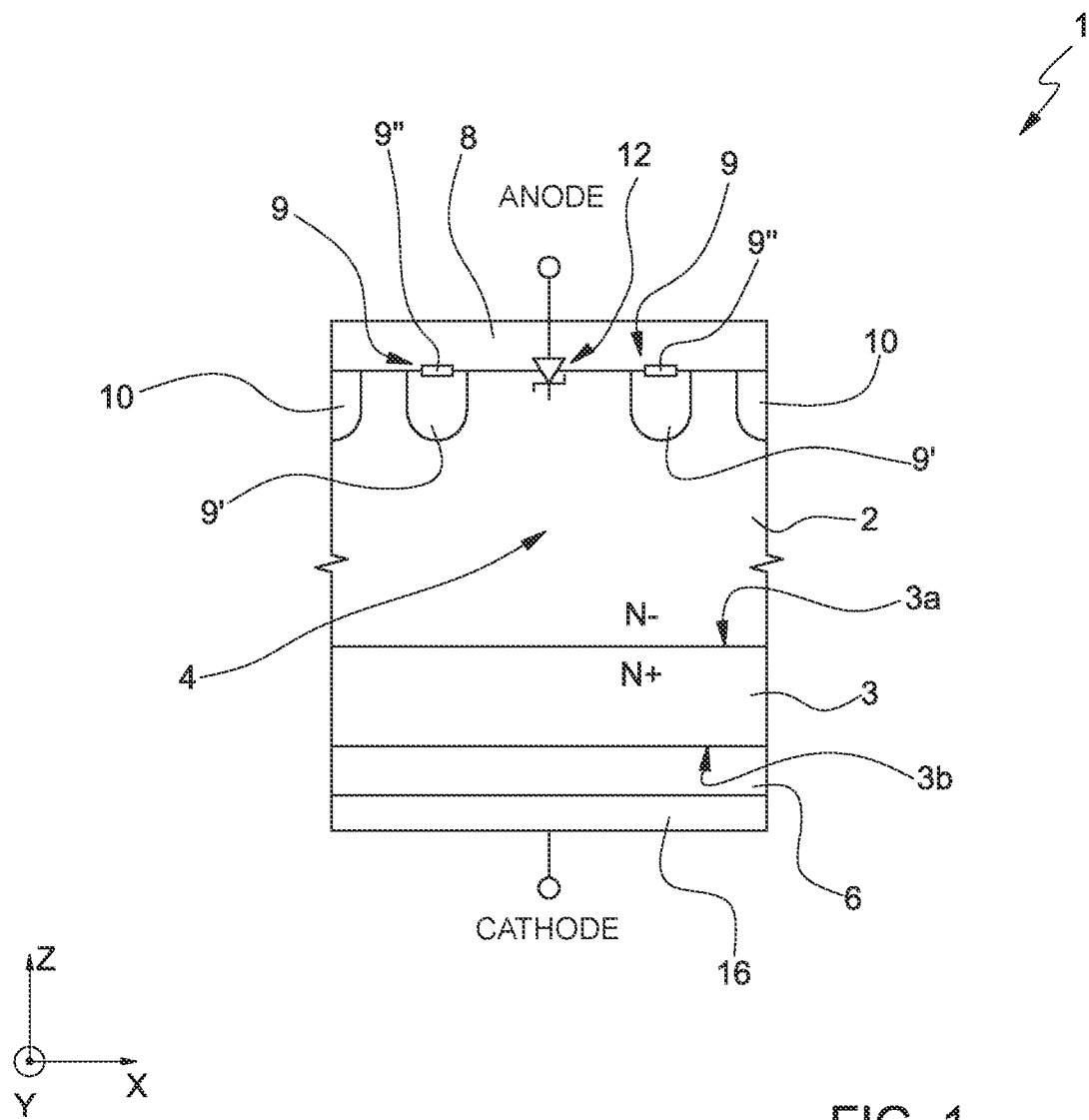
FIG. 1 shows, in cross-sectional view, an MPS device according to a known embodiment.
Figure 2:
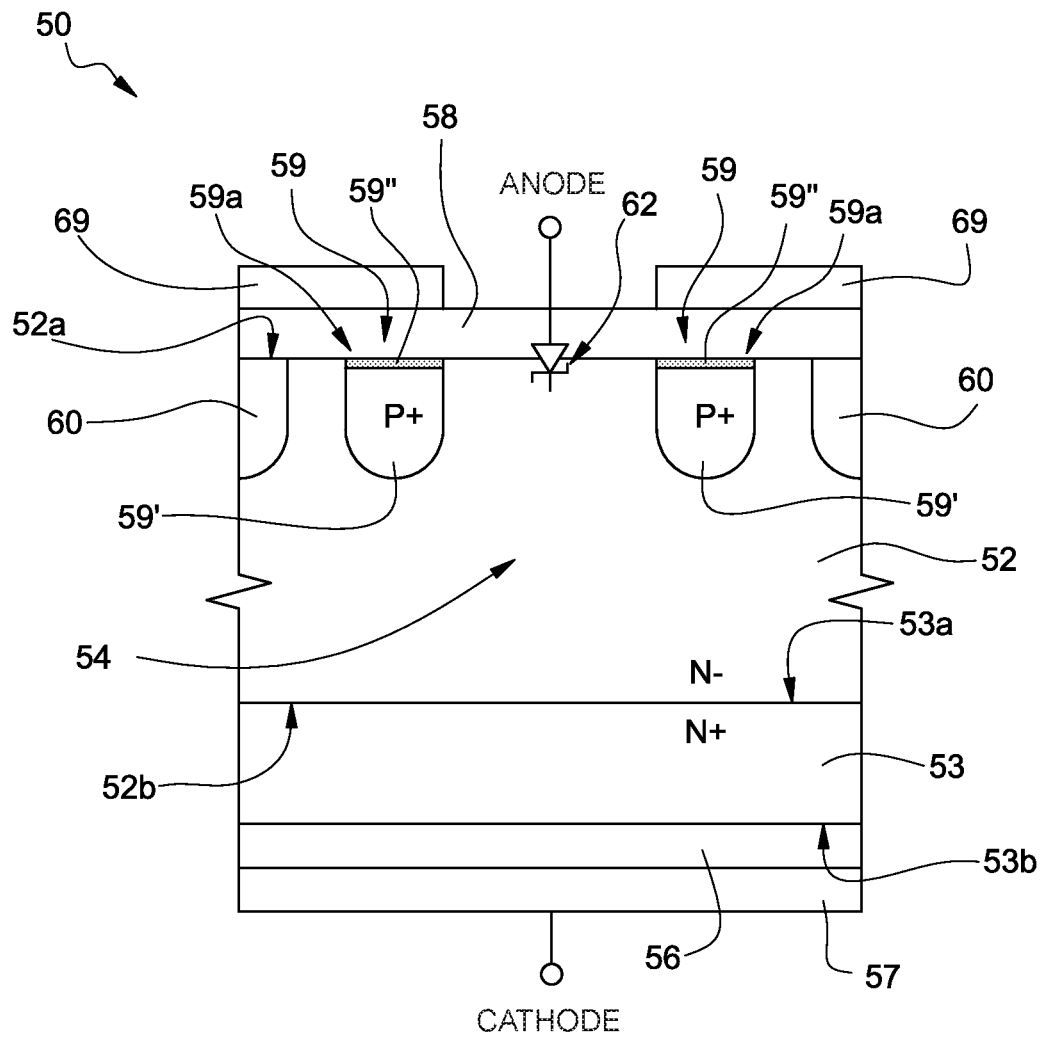
FIG. 2 shows, in cross-sectional view, an MPS device according to one embodiment of the present disclosure.

FIG. 2 shows, in lateral sectional view in a (triaxial) Cartesian reference system of axes X, Y, Z, an MPS device 50 according to one aspect of the present disclosure.

The MPS device 50 includes: a substrate 53, of silicon carbide (SiC) of a first conductivity type (such as N type), having a first doping concentration, provided with a surface 53a opposite to a surface 53b, and having a thickness comprised between 50 µm and 350 µm, more in particular between 160 µm and 200 µm, for example 180 µm; a drift layer 52 (grown in an epitaxial way), which is made of SiC of the first conductivity type, has a second doping concentration lower than the first doping concentration, extends over the surface 53a of the substrate 53, and has a thickness, for example, comprised between 5 and 15 µm; an ohmic contact region or layer 56 (made, for example, of nickel silicide), which extends over the surface 53b of the substrate 53; a cathode metallization 57, made, for example, of titanium nickel vanadium silver (Ti/NiV/Ag) or titanium nickel vanadium gold (Ti/NiV/Au), which extends over the ohmic contact region 56; an anode metallization 58, made, for example, of titanium aluminum silicon copper (Ti/AlSiCu) or nickel aluminum silicon copper (Ni/AlSiCu), which extends over a top surface 52a of the drift layer 52; a passivation layer 69 on the anode metallization 58, for protecting the latter; multiple junction-barrier (JB) elements 59 in the drift layer 52, which face the top surface 52a of the drift layer 52 and each include a respective implanted region 59' of a second conductivity type (such as P type) and an ohmic contact 59"; and an edge-termination region, or protection ring, 60 (optional), in particular an implanted region of the second conductivity type, which completely surrounds the JB elements 59.

One or more Schottky diodes 62 are formed at the interface between the drift layer 52 and the anode metallization 58, laterally with respect to the implanted regions 59'. In particular, Schottky junctions (of the semiconductor-metal type) are formed by portions of the drift layer 52 in direct electrical contact with respective portions of the anode metallization 58.

The region of the MPS device 50 that includes the JB elements 59 and the Schottky diodes 62 (i.e., the region contained within the protection ring 60) is an active area 54 of the MPS device 50.

According to one aspect of the present disclosure, each ohmic contact 59" is formed by one or more carbon-rich layers, including for example graphite layers, or graphene multi-layers. More in particular, each ohmic contact 59" has, at the surface 52a, a SiC amorphous layer where the number of carbon atoms is preponderant (for example, at least twice as high, in particular from twice to one hundred times as high) as compared to the number of silicon atoms, following upon phase separation between the silicon atoms and the carbon atoms of the SiC substrate. Underneath this amorphous layer, each ohmic contact 59" may present a layer including carbon clusters (e.g., a graphite layer), having a greater thickness than the amorphous layer. Formation of such an ohmic contact 59" is due to thermal decomposition of silicon carbide, as a result of the manufacturing process illustrated in what follows.

According to a further aspect of the present disclosure, the ohmic contacts 59" are self-aligned, at the surface 52a, with the implanted regions 59' (i.e., in top plan view in the plane XY, the ohmic contacts 59" have the same shape and extension as the implanted regions 59'). In this case, the electrical contact between the anode metallization 58 and the implanted regions 59' occurs exclusively through the ohmic contacts 59".

In addition, according to a further aspect of the present disclosure, the ohmic contacts 59" do not extend, along Z, beyond the surface 52a; in other words, the ohmic contacts 59" have a top surface 59a that is co-planar (i.e., aligned along X) with the surface 52a, and extend in depth (along Z) within the ohmic contacts 59' for a depth comprised between one nanometer and some tens of nanometers (e.g., between 1 and 20 nm) measured starting from the surface 52a.

The steps of formation of the ohmic contacts 59' are described in what follows, with explicit reference to the steps for manufacturing the MPS device 50 (FIGS. 3-6).

Figure 3:
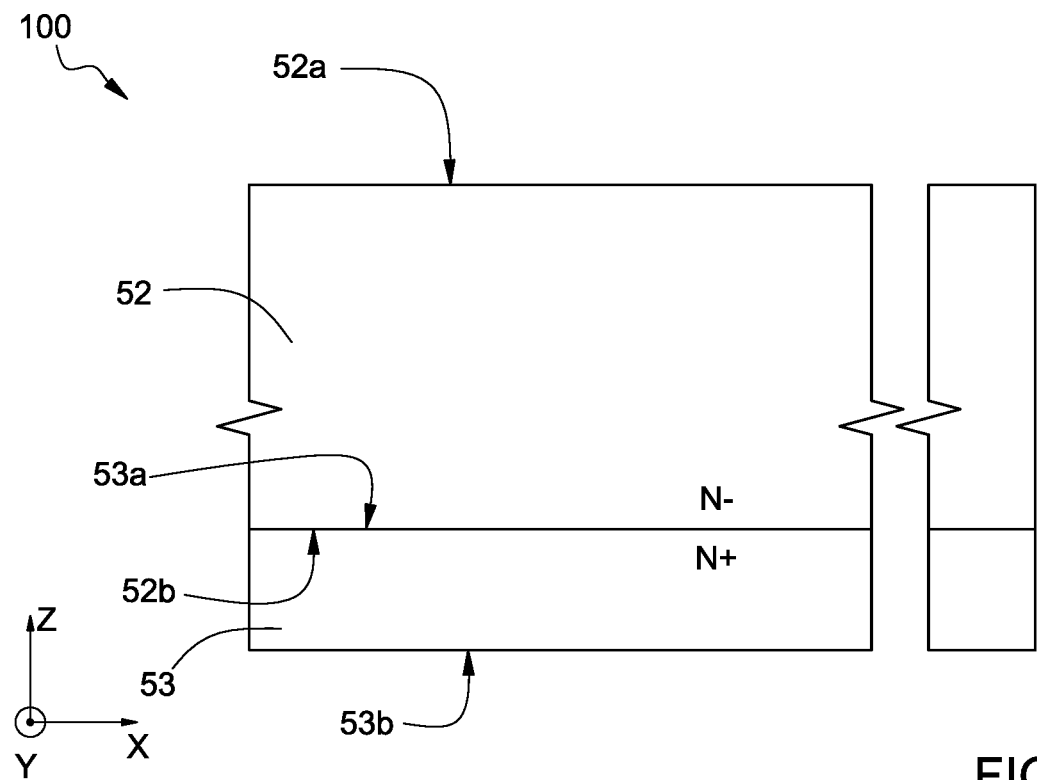
FIGS. 3-6 show steps for manufacturing the device of FIG. 2, according to one embodiment of the present disclosure.

With reference to FIG. 3, a wafer 100 is provided, including a SiC substrate 53 (in particular 4H-SiC; however, other polytypes may be used, such as, though not exclusively, 2H-SiC, 3C-SiC, and 6H-SiC).

The substrate 53 has a first conductivity type (in this embodiment a doping of N type), and is provided with a front surface 53a and a back surface 53b, which are opposite to one another along the axis Z. The substrate 53 has a doping concentration comprised between $1\cdot10^{19}$ and $1\cdot10^{22}$ atoms/cm$^3$.

The front of the wafer 100 corresponds to the front surface 53a, and the back of the wafer 100 corresponds to the back surface 53b. The resistivity of the substrate 30 is comprised, for example, between 2 mΩ·cm and 40 mΩ·cm.

Formed on the front surface 53a of the substrate 53, for example by epitaxial growth, is the drift layer 52, of silicon carbide having the first conductivity type (N) and having a doping concentration lower than that of the substrate 53, for example, comprised between $1\cdot10^{14}$ and $5\cdot10^{16}$ atoms/cm$^3$. The drift layer 52 is made of SiC, in particular 4H-SiC, but it is possible to use other polytypes of SiC, such as 2H, 6H, 3C, or 15R.

The drift layer 52 has a thickness defined between a top side 52a and a bottom side 52b (the latter being in direct contact with the front surface 53a of the substrate 53).

Next (FIG. 4), on the top side 52a of the drift layer 52 a hard mask 70 is formed, for example by deposition of a photoresist, or TEOS, or another material designed for the purpose. The hard mask 70 has a thickness comprised between 0.5 µm and 2 µm or in any case a thickness such as to shield the implant described hereinafter with reference once again to FIG. 4. The hard mask 70 extends in a region of the wafer 100 where, in subsequent steps, the active area 54 of the MPS device 50 will be formed.

Figure 6:
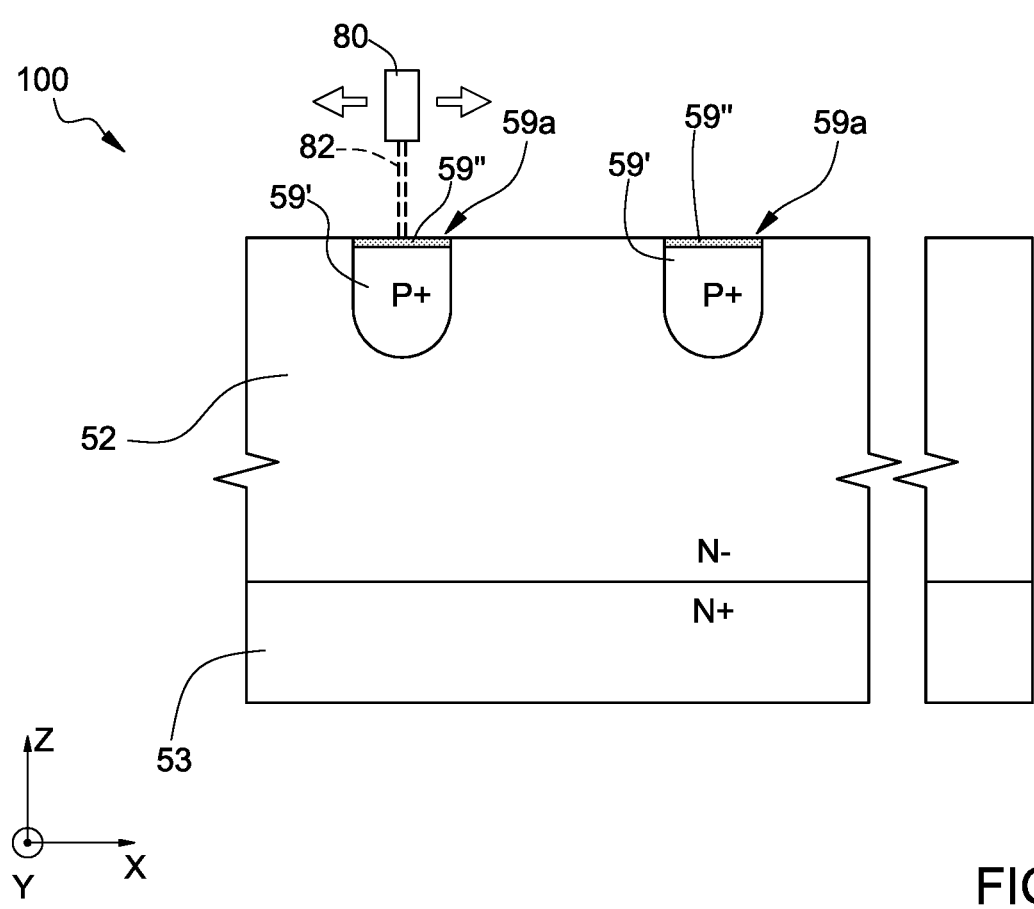

In top plan view in the plane XY, the hard mask 70 covers the regions of the top side 52a of the drift layer 52 that will form Schottky cells (diodes 62) and leaves exposed the regions of the top side 52a of the drift layer 52 that will cone to form the implanted regions 59', already identified with reference to FIG. 6.

A step is then carried out of implantation of dopant species (for example, boron or aluminum), which have the second conductivity type (here a conductivity of P type), exploiting the hard mask 70 (the implantation is indicated in the figure by the arrows 72). During the step of FIG. 4, the protection ring 60, if present, is also formed.

Figure 4:
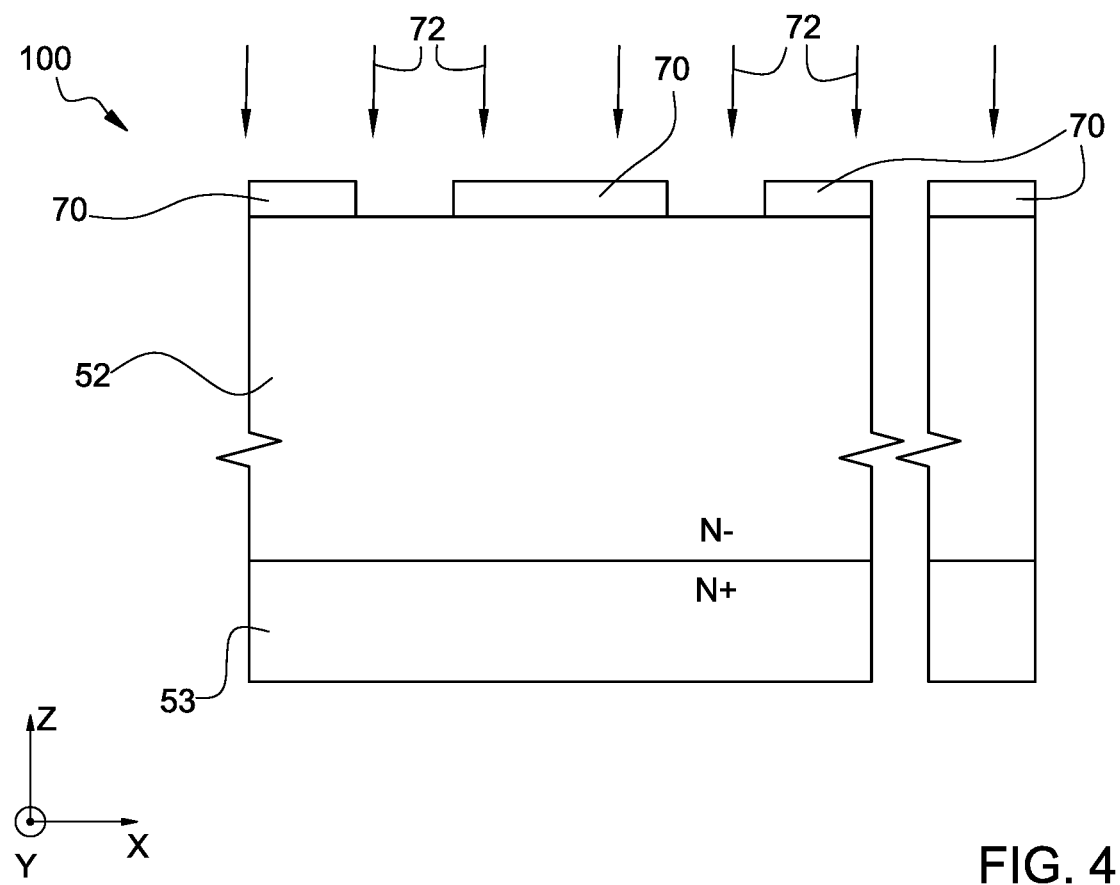

In an embodiment provided by way of example, the implantation step of FIG. 4 comprises one or more implantations of dopant species, which have the second conductivity type, with an implantation energy comprised between 30 keV and 400 keV and with doses comprised between $1\cdot10^{12}$ atoms/cm$^2$ and $1\cdot10^{15}$ atoms/cm$^2$ to form the implanted regions 59' with a doping concentration of higher than $1\cdot10^{18}$ atoms/cm$^3$. Implanted regions are thus formed having a depth, measured starting from the surface 52a, comprised between 0.4 µm and 1 µm.

Figure 5:
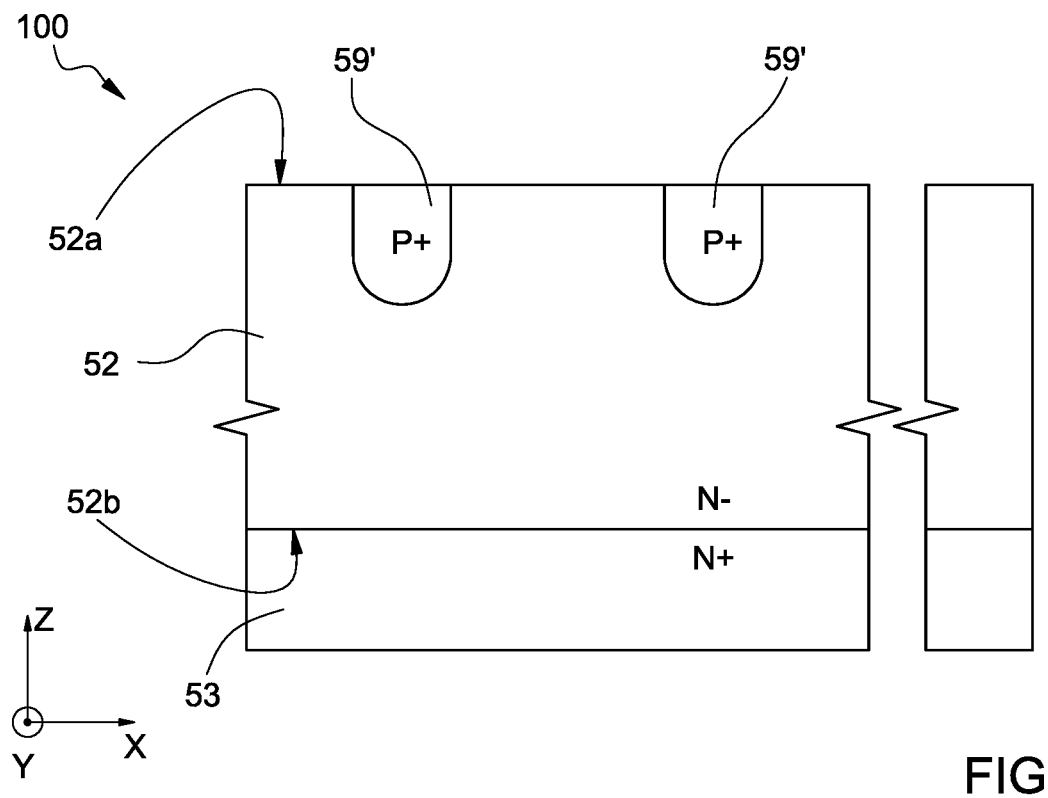

Next, in FIG. 5, the mask 70 is removed and, in FIG. 6, at the surface 52a a thermal budget is generated designed to favor generation, at the implanted regions 59', of the aforementioned one or more carbon-rich layers (for example, graphene and/or graphite layers).

For this purpose, a laser source 80 is used configured to generate a beam 82 such as to heat locally the surface 52a (in particular, the implanted regions 59') up to a temperature of approximately 1500° C.-2600° C. Given the maximum depth of the implanted regions 59', a temperature of approximately 2000° C. at the level of the surface 52a is sufficient to guarantee temperatures within the range identified above also at the maximum depth reached by the implanted regions 59' (e.g., of 1 µm).

This temperature is such as to favor generation of compounds of the ohmic contacts that are rich in carbon exclusively at the implanted regions 59', and not at the surface 52a that is without the implanted regions 59'. This effect, of a per se known type, is described for example by Maxime G. Lemaitre, "Low-temperature, site selective graphitization of SiC via ion implantation and pulsed laser annealing," APPLIED PHYSICS LETTERS 100, 193105 (2012).

In one embodiment, transformation of part of the implanted regions 59' into ohmic contacts 59" occurs by heating the entire wafer 100, moving the laser 80 appropriately.

In a further embodiment, transformation of the surface portions of the implanted regions 59' into ohmic contacts 59" occurs by heating the useful surface of the wafer 100. By "useful surface" is here meant the surface portion of the drift layer 52 that includes the implanted regions 59', for example delimited on the outside by the edge-termination region 10; the useful surface might not correspond to the entire surface of the wafer 100 (for example, excluding possible portions of the wafer 100 lateral with respect to the active area 54 that are not of interest during use of the MPS device 50 in so far as they do not take part in transport of electric charge).

According to a further embodiment, it is possible to provide above the surface 52a (whether in contact with the surface 52a or at a distance therefrom) a mask having regions transparent to the beam 82 (i.e., the beam 82 traverses them) and regions opaque to the beam 82 (i.e., the beam 82 does not traverse them, or traverses them in attenuated form such as not to cause significant heating of the portions of the wafer 100 that extend underneath). The transparent regions of the mask are aligned with the implanted regions 59' to enable formation of the respective ohmic contact 59".

Irrespective of the embodiment adopted, there are simultaneously formed the implanted regions 59' (in particular, the doping are activated to obtain a concentration of dopant species comprised approximately between $1\cdot10^{17}$ atoms/cm$^3$ and $1\cdot10^{20}$ atoms/cm$^3$) and the ohmic contacts 59" for each implanted region. In addition, since the ohmic contact is formed exclusively at the implanted regions 59', even in the absence of a mask there is a self-alignment between the implanted regions 59' and the respective ohmic contact 59". This feature translates into a technical advantage, in that it is possible to maximize the extension area of the ohmic contacts without the risk of short circuiting with neighboring ohmic contacts. In fact, since each ohmic contact 59" has the same shape and extension as the respective implanted region 59', there is no risk of an undesirable lateral extension of said ohmic contact beyond such implanted region 59'. Maximizing the area of the ohmic contact allows maximizing the current carried by said ohmic contact.

At the implanted regions 59', the localized and superficial increase in temperature causes formation of the ohmic contact 59"; laterally with respect to the implanted regions 59', this effect is not noted. Transformation of the SiC of P type into graphene occurs at temperatures comprised between 1200° C. and 2600° C., more in particular at temperatures higher than 1600° C. According to the present disclosure, these temperatures are reached at a surface portion (of some nanometers in depth, e.g., 1-20 nm) of the implanted regions 59'. At greater depths the temperature decreases to values such as no longer to cause transformation of silicon carbide into carbon-rich layers (graphene and/or graphite layers). The ohmic contact formation 59" is thus self-limited. Consequently, the ohmic contact 59" does not extend throughout the thickness of the respective implanted region, but exclusively at the surface level thereof.

The laser 80 is, for example, a UV excimer laser. Other types of laser may be used, amongst which lasers having wavelengths in the region of the visible.

The parameters of configuration and actuation of the laser 80, optimized for achieving the purpose of the present disclosure, i.e., for enabling formation of a graphene ohmic contact at the implanted regions 59', are the following:

- wavelength between 290 and 370 nm, in particular 310 nm;
- pulse duration between 100 ns and 300 ns, in particular 160 ns;
- number of pulses between 1 and 10, in particular 4;
- energy density between (2) 1.6 and 4 J/cm$^2$, in particular (3) 2.6 J/cm$^2$ (considered at the level of the surface 52a);
- temperature between 1400° C. and 2600° C., in particular 1800° C. (considered at the level of the surface 52a).

The spot area of the beam 82 at the level of the surface 52a is, for example, comprised between 0.7 and 1.5 cm$^2$.

To cover the entire wafer 100, or the sub-region of the wafer 100 to be heated, one or more scans of the laser 80 are thus performed in the plane XY (e.g., a plurality of scans parallel to one another and to the axis X and/or the axis Y).

Figure 7:
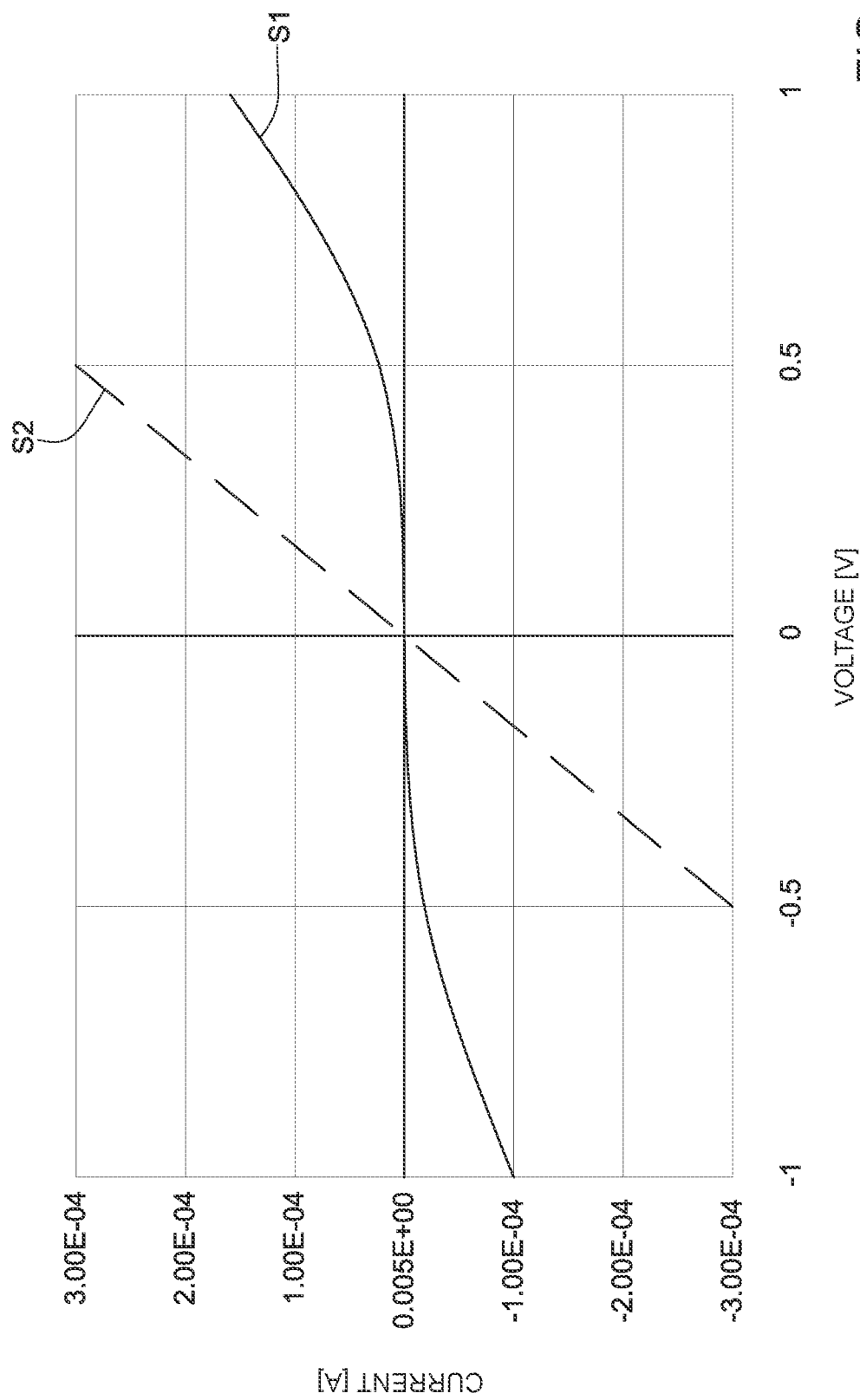
FIG. 7 illustrates voltage-current curves of the device manufactured according to the present disclosure.

The present applicant has, however, found that, with the parameters identified previously, the desired electrical behavior for the MPS device 50 is obtained. FIG. 7 illustrates, in this regard, experimental data of variation of the conduction current as a function of the voltage applied between the anode and the cathode of the MPS device 50. The curve S1 regards electrical measurements at the PiN diode prior to the laser treatment, whereas the curve S2 regards electrical measurements at the PiN diode after laser treatment, and thus with the ohmic contact formed. The profiles of the curves S1 and S2 confirm the expected behavior.

From an examination of the characteristics of the disclosure provided according to the present disclosure the advantages that it achieves are evident.

Finally, it is clear that modifications and variations may be made to what has been described and illustrated herein, without thereby departing from the scope of the present disclosure.

In particular, as already noted previously, the present disclosure is not limited to ohmic contact formation in an MPS device, but extends to ohmic contact formation in a generic vertical-conduction electronic device, such as a Schottky diode, a JBS diode, a MOSFET, an IGBT, a JFET, a DMOS, etc.

The present disclosure is directed to a method for manufacturing a SiC-based electronic device (50) that includes implanting, at a front side (52a) of a solid body (52) of SiC having a conductivity of N type, dopant species of P type, thus forming an implanted region (59') that extends in depth in the solid body starting from the front side (52a) of the solid body and has a top surface co-planar with said front side (52a) of the solid body; and generating a laser beam (82) directed towards said implanted region (59') in order to generate heating of the implanted region (59') to temperatures comprised between 1500° C. and 2600° C., so as to form an ohmic contact region (59") including one or more carbon-rich layers, in particular graphene and/or graphite layers, in said implanted region (59'), and, simultaneously, activate said dopant species of P type.

The laser beam (82) is generated according to the following parameters: wavelength between 290 nm and 370 nm, in particular 310 nm; pulse duration between 100 and 300 ns, in particular 160 ns; number of pulses between 1 and 10, in particular 4; energy density between 1.6 and 4 J/cm$^2$, in particular 2.6 J/cm$^2$. The method includes heating of the implanted region (59') takes place throughout the thickness, along said direction (Z), of the implanted region (59'). The forming the ohmic contact region (59") comprises forming said one or more carbon-rich layers within the implanted region (59') starting from the front side (52a).

The ohmic contact region (59") has an own top surface coinciding with the top surface of the implanted region (59'). The ohmic contact region (59") has a thickness comprised between 1 nm and 20 nm. The material of the solid body is one of: 4H-SiC, 6H-SiC, 3C-SiC, 15R-SiC. The electronic device (50) is one of: a merged-PiN-Schottky diode, a Schottky diode, a JBS diode, a MOSFET, an IGBT, a JFET, and a DMOS.

The electronic device (50) is a merged-PiN-Schottky (MPS) diode, the method comprising the steps of forming said solid body, including: providing a SiC substrate of N type having an own front side and an own back side opposite to one another, and epitaxially growing, on the front side of the substrate, a drift layer (52) of SiC of N type; forming a first electrical terminal (58) in electrical contact with the doped region (59') via the ohmic contact region (59") and in direct electrical contact with the drift layer (52) laterally with respect to the doped region (59') so as to form a junction-barrier (JB) diode with said doped region (59') and a Schottky diode with the drift layer (52); and forming a second electrical terminal (57) on the back side of the substrate.

The present disclosure a SiC-based electronic device (50) a solid body (52) of SiC having a conductivity of N type; an implanted region (59') at a front side (52a) of the solid body (52), which includes dopant species of P type, extends in depth in the solid body starting from the front side (52a), and has a top surface co-planar with said front side (52a) of the solid body; and an ohmic contact region (59"), which includes one or more carbon-rich layers, in particular graphene and/or graphite layers, and extends in said implanted region (59'). The ohmic contact region (59") includes said one or more carbon-rich layers, which extend exclusively within the implanted region (59') starting from the front side (52a) of the solid body.

The ohmic contact region (59") has an own top surface coinciding with the top surface of the implanted region (59'). The ohmic contact region (59") has a thickness comprised between 1 nm and 20 nm. The material of the solid body is one of: 4H-SiC, 6H-SiC, 3C-SiC, 15R-SiC. The device is chosen among: a merged-PiN-Schottky diode, a Schottky diode, a JBS diode, a MOSFET, an IGBT, a JFET, and a DMOS. The device being a merged-PiN-Schottky (MPS) diode type, wherein the solid body includes a SiC substrate of N type having an own front side and an own back side opposite to one another, and a drift layer (52) of SiC of N type on the front side of the substrate, further comprising: a first electrical terminal (58) in electrical contact with the doped region (59') via the ohmic contact region (59") and in direct electrical contact with the drift layer (52) laterally with respect to the doped region (59') so as to form a junction-barrier (JB) diode with said doped region (59') and a Schottky diode with the drift layer (52); and a second electrical terminal (57) on the back side of the substrate.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for manufacturing a SiC-based electronic device, comprising:
    forming an implanted region by implanting dopants of a first conductivity type on a first side of a solid body of silicon carbide (SiC) having dopants of a second conductivity type, the first conductivity type being different than the second conductivity type, the implanted region extending in the solid body from the first side toward a second side, the implanted region having a first surface that is coplanar with a second surface of the first side; and
    forming an ohmic contact region including one or more carbon-rich layers of graphene, graphite, or a combination of graphene or graphite in the implanted region by generating a laser beam with a wavelength in the range of 290 nm and 370 nm with a pulse duration in the range of 100 ns and 300 ns directed towards the implanted region thereby heating the implanted region to temperatures in the range of 1500° C. and 2600° C., and simultaneously, activating the dopant of the first conductivity type.

2. The method according to claim 1 wherein generating the laser beam includes:
    generating a number of pulses in the range of 1 and 10; wherein an energy density is in the range of 1.6 J/cm$^2$ and 4 J/cm$^2$.

3. The method according to claim 2 wherein generating the laser beam includes generating the wavelength to be 310 nm, the pulse duration to be 160 ns, the number of pulses to be 4, and the energy density to be 2.6 J/cm$^2$.

4. The method according to claim 1 wherein forming the ohmic contact region comprises forming said one or more carbon-rich layers within the implanted region starting from the first side.

5. The method according to claim 4 wherein said ohmic contact region has a top surface coinciding with the first surface of the implanted region.

6. The method according to claim 1 wherein said ohmic contact region has a thickness in the range of 1 nm and 20 nm.

7. The method according to claim 1 wherein said ohmic contact region has, in top plan view, a form and extension coinciding with a form and extension of the implanted region.

8. The method according to claim 1 wherein material of the solid body is one from among: 4H-SiC, 6H-SiC, 3C-SiC, and 15R-SiC.

9. The method according to claim 8 wherein said electronic device is a merged-PiN-Schottky diode, the method comprising:
    epitaxially growing, on a first side of a substrate, a drift layer of SiC of an N type;
    forming a junction-barrier diode with the doped region and a Schottky diode with the drift layer by forming a first electrical terminal in electrical contact with the doped region via the ohmic contact region and in direct electrical contact with the drift layer laterally with respect to the doped region; and
    forming a second electrical terminal on a second side of the substrate.

10. A method, comprising:
    forming a PiN-Schottky device by:
        forming an implanted region at a first side of a solid body having a first conductivity type, which includes dopant species of a second conductivity type that is different from the first conductivity type, extends in depth in the solid body starting from the first side, and has a top surface co-planar with said first side of the solid body;
        forming an ohmic contact region, which includes one or more carbon-rich layers having graphene, graphite, or a combination of graphene and graphite, and extends in the implanted region;
        forming an anode metallization layer on the first side of the solid body, the anode metallization layer having a first face opposite the first side of the solid body; and
        forming a passivation layer on the first face, the passivation layer including an opening that exposes a central region of the anode metallization layer.

11. The method of claim 10 wherein the passivation layer overlaps the ohmic contact region.

12. The method of claim 10 wherein the forming of the ohmic contact region includes extending the one or more carbon-rich layers exclusively within the implanted region starting from the first side of the solid body.

13. The method of claim 10 wherein the forming of the ohmic contact region includes forming an ohmic contact top surface coinciding with the top surface of the implanted region.

14. A method, comprising:
    forming an active layer on a silicon carbide substrate of a first conductivity type, the active layer including a surface;
    forming a first implanted region in the active layer, the first implanted region having a second conductivity type that is different from the first conductivity type;
    forming, by generating a laser beam with a wavelength in the range of 290 nm and 370 nm, a first ohmic contact including carbon, the first ohmic contact being between a first surface of the first implanted region and the silicon carbide substrate;
    forming a second implanted region in the active layer, spaced from the first implanted region, the second implanted region having the second conductivity type; and
    forming a second ohmic contact, the second ohmic contact being between a second surface and the silicon carbide substrate, the second surface is coplanar with the first surface and coplanar with the surface of the active layer.

15. The method of claim 14 wherein the second ohmic contact includes carbon.

16. The method of claim 14, comprising forming an anode metallization layer on the surface of the active layer, the anode metallization layer having a first face opposite a first side of the active layer.

17. The method of claim 16, comprising forming a passivation layer on the first face, the passivation layer including an opening that exposes a central region of the anode metallization layer, the opening extending from the first ohmic contact to the second ohmic contact.

* * * * *